United States Patent [19]
Kilpatrick

[11] Patent Number: 6,018,794
[45] Date of Patent: Jan. 25, 2000

[54] DATA PROCESSING APPARATUS AND METHOD FOR GENERATING TIMING SIGNALS FOR A SELF-TIMED CIRCUIT

[75] Inventor: Michael Thomas Kilpatrick, Cherry Hinton, United Kingdom

[73] Assignee: Arm Limited, Cambridge, United Kingdom

[21] Appl. No.: 08/841,594

[22] Filed: Apr. 30, 1997

[51] Int. Cl.[7] .......................... G06F 13/00; G11C 11/407; G11C 11/413
[52] U.S. Cl. .......................... 711/167; 711/144; 365/210; 365/227; 365/233
[58] Field of Search ..................................... 711/144, 167, 711/154; 365/210, 233, 227, 205; 395/555, 559; 713/324, 320

[56] References Cited

U.S. PATENT DOCUMENTS

| | | | |
|---|---|---|---|
| 4,712,190 | 12/1987 | Guglielmi et al. | 711/167 |
| 4,926,387 | 5/1990 | Madland | 365/233 |
| 5,018,111 | 5/1991 | Madland | 365/233 |
| 5,031,141 | 7/1991 | Guddat et al. | 365/233 |
| 5,325,337 | 6/1994 | Buttar | 365/210 |
| 5,553,276 | 9/1996 | Dean | 395/555 |
| 5,668,766 | 9/1997 | Bramnik | 365/205 |
| 5,724,294 | 3/1998 | Khieu | 365/210 |

*Primary Examiner*—Glenn Gossage
*Attorney, Agent, or Firm*—Nixon & Vanderhye P.C.

[57] ABSTRACT

A self-timed data processing circuit and method of operation of such a circuit are disclosed. The circuit comprises a plurality of components, such as memory cells, arranged to generate substantially simultaneously a plurality of first output signals, each representing variable data bits. A timed circuit, which may include a plurality of sense amplifiers, is then arranged to receive the first output signals and to generate second output signals for use in subsequent data processing operations, the information content of the second output signals being dependent on the data bits represented by the first output signals. A subset of the components, such as memory cells storing dirty and valid bits for a cache memory, are arranged to generate first output signals representing data bits that are coded so as to cause at least one of the second output signals generated by the timed circuit to transition from its state prior to the generation of the first output signals. Control circuitry, responsive to the state transition of the at least one second output signal, is then used to generate a timing signal used to control the operation of the timed circuit to provide reduced power consumption. This also enables a reference timing signal to be created to self-time the data processing circuit, without the need to duplicate the critical path of the data processing circuit by using additional reference components.

18 Claims, 4 Drawing Sheets

DATA PROCESSING APPARATUS AND METHOD FOR GENERATING TIMING SIGNALS FOR A SELF-TIMED CIRCUIT

BACKGROUND OF THE INVENTION

1. Field of the Invention

The present invention relates to techniques for performing self-timing within a data processing apparatus.

2. Description of the Prior Art

Self-timing techniques are typically used to control certain systems that require knowledge of the period of their operation in order to schedule events based on the completion of that operation. A typical example of such a system is one where sense amplifiers are used, for example in Static Random Access Memory (SRAM) systems or other systems employing precharged structures. Power is supplied to a sense amplifier to enable it to sense any changes in the signals input to the sense amplifier, and to produce a particular output signal dependent on the changes in the input signals. In order to reduce power consumption, it is desirable to switch off the sense amplifiers as soon as they have evaluated any changes in their input signals and produced the corresponding output, since the sense amplifiers consume relatively high currents during their operation.

It will be appreciated by those skilled in the art that other forms of multistable circuits, other than sense amplifiers, may be employed to give rapid determination of outputs based on slow input data, and such circuits may use self-timed control in applications where power consumption is to be kept at a minimum, but in which output data must be determined as early as possible.

Self-timing is ususally achieved by having a series of additional reference components that operate in parallel to the system being self-timed and have identical output timing characteristics to it. However, the additional reference components are arranged such that, on evaluating their inputs, there is always a determinate reference transition. This reference transition may then by used, for example, either to indicate to other systems that the output data of the system is ready, or to control functional units within the system by, for example, disabling costly current-consuming sense amplifiers at the earliest opportunity.

There are two main disadvantages with the use of such additional reference components to perform the self-timing of the system. Firstly, the additional reference components required to perform the self-timing function take up space on the data processing circuit. Generally, when developing data processing circuits, there is a desire to keep the circuit as small as possible. The space that a circuity, such as an integrated circuit, occupies is at a premium. The smaller an integrated circuit is, the less expensive it will be to manufacture and the higher the manufacturing yield. For this reason, measures that reduce the size of an integrated circuit are strongly advantageous.

Secondly, by their very nature, the additional reference components performing the self-timing function will always be arranged to cause a transition in the signal output by those reference components. This process itself consumes power, and generally it is desirable to keep power consumption within a circuit as low as possible. It is becoming more commonplace for integrated circuits to be used in products which operate from battery power, such as portable laptop computers, mobile phones, personal organisers, etc. In such situations, it is clearly desirable to reduce the power consumption of these processing devices as much as possible, in order to improve the battery life of the products, i.e. the amount of time the products can be used for before needing to replace or recharge the batteries. However, it is not just in the area of battery powered products, where power consumption is a concern. The higher the power consumption, then the greater the heat generated by the integrated circuit. Hence, there is generally a desire to reduce power consumption wherever possible.

Hence, it is an object of the present invention to provide a data processing apparatus and method which is self-timed, but which consumes less power, and occupies less space, than the above described prior art self-timed data processing apparatus.

SUMMARY OF THE INVENTION

Accordingly, the present invention provides a data processing circuit, comprising: a plurality of components arranged to be responsive to a command to generate substantially simultaneously a plurality of first output signals representing data bits, a timed circuit arranged to receive the first output signals and to generate second output signals for use in subsequent data processing operations, the information content of the second output signals being dependent on the data bits represented by the first output signals; a subset of the components being arranged to generate first output signals representing data bits that are coded so as to cause at least one of the second output signals generated by the timed circuit to transition from its state prior to the generation of the first output signals; and control circuitry, responsive to the state transition of said at least one second output signal to generate a timing signal used to control the operation of said time circuit.

The present invention provides a technique for creating a reference timing signal for a system without the need for duplicating the critical path of the system by using additional reference components. This is achieved by coding a certain number of data bits such that the first output signals generated by a subset of the components will cause at least one of the second output signals generated by the timed circuit to transition from its state prior to the generation of the first output signals. As with the other second output signals generated by the apparatus, this at least one of the second output signals is used for subsequent events scheduled by the system. However, in addition, control circuitry is arranged to generate a timing signal in response to the state transition of the at least one of the second output signals, this timing signal being used to control the operation of the timed circuit. By this approach, the data processing circuit can be self-timed, without requiring additional reference components to be added to duplicate the critical path of the system.

The technique of preferred embodiments of the invention enables power consumption to be reduced within any system in which a set of transitions occurring on a given collection of signals are used to schedule one or more further events, by means of it being known:

a) when those transitions have completed;

b) that the transitions are all substantially simultaneous; and c) that the set of transitions may be limited to some subset of all of the sets of transitions physically possible.

In preferred embodiments of the present invention, the given collection of output signals will have a pre-evaluation, or a "precharged", state, for example a logical "0" state, followed by an evaluation phase during which a certain number of the signals may transition from the pre-evaluation state to a new state. The remainder of the signals will have an evaluated state that happens to be identical to the pre-evaluation state, such that no actual logic-level transition occurs. The evaluated state will remain stable for some known length of time during which the output values may be observed, the system subsequently being returned to its precharged state in order that a new evaluation may take place based on new input stimulus.

In such a system, it will be apparent that, if the evaluation phase can result in none of the output signals transitioning from the precharged state to another state, then the completion of the evaluation phase can, in accordance with prior art techniques, only be determined by use of a reference signal that displays identical timing characteristics to the output signals, but has the behavior of always having an identifiable transition from the precharged state to a different state upon evaluation. However, as discussed earlier, the addition of a reference signal represents some redundant circuitry in terms of physical area, and will also add to the power consumption of the system by the transitioning of the extra nodes associated with the reference components.

However, in accordance with preferred embodiments of the present invention, it has been realized that, in many situations, the set of permissable output states may be limited to less than the theoretical maximum (i.e. it has been found that for a set of "n" digital signals, it is often the case that the possible permutations may be limited to less than 2 to the power of n), and in such situations it has been found that the data may be coded in such a way as to guarantee at least one transition from the precharged state to a different state on a certain subset of all the signals. By using this approach, a data processing circuit in accordance with the preferred embodiments of the present invention may be arranged such that a reference timing signal may be derived from the direct logical OR combination of the subset of the signals. This removes the requirement for extra reference components and separate reference signals, and thus represents a saving in power consumption and physical area of the system.

In preferred embodiments, the timed circuit comprises a plurality of sensing circuits, each sensing circuit being arranged to receive the first output signal from a corresponding one of the plurality of components, the second output signals having a predetermined first state prior to the generation of the first output signals, and the sensing circuits being arranged to determine from the received first output signals whether to change their second output signals to a second state.

Sensing circuits, such as sense amplifiers, are often used to quickly evaluate changes in the levels of precharged lines input to those sensing circuits, and to generate output signals dependent on the changes detected on the precharged input lines. They are very effective in providing rapid determination of output signals based on relatively slowly changing input data, but, as mentioned earlier, do consume relatively high currents during the evaluation period. However, in accordance with preferred embodiments of the present invention, the subset of the components is arranged to generate first output signals representing data bits that are coded so as to cause at least one of the second output signals generated by the corresponding subset of sensing circuits to transition from the first to the second state. Hence, in accordance with the preferred embodiments of the present invention, this transition in at least one of the second output signals may be used to generate a timing signal to disable the operation of the sensing circuits, thereby avoiding unnecessary power consumption by the sensing circuits.

In preferred embodiments, the control circuitry comprises a logic gate arranged to receive the at least one of the second output signals and to generate a timing signal used to disable the sensing circuits. It will be appreciated by those skilled in the art that the logic levels defining the first and second states are immaterial, so long as the logic level of the first state is different to the logic level of the second state. In preferred embodiments, the first state corresponds to a logic 0 level and the second state corresponds to a logic 1 level, and the logic gate is a logical OR gate arranged to receive the said at least one of the second output signals and to generate timing signal having a logic 1 level used to disable the sensing circuits when the at least one of the second output signals has the second state.

In preferred embodiments, the plurality of components are memory cells, the memory cells for example being elements within a cache. The cache may contain Content Addressable Memory (CAM) or Random Access Memory (RAM), or indeed may contain both CAM and RAM structures. Preferably, the memory cells will be static memory cells, such as CAM or SRAM cells. However, it will be appreciated by those skilled in the art that dynamic memory cells may also be used, dynamic memory cells generally being smaller than static memory cells and hence typically being used in situations where high density is required.

In preferred embodiments, the subset of the components comprise those memory cells containing dirty and valid bit information. The dirty bit is used to identify whether the corresponding cache entry has or has not been altered since it was placed in the cache. Further, the valid bit is used to indicate whether the entry is still valid, or whether it has been rendered useless, i.e. invalid. A cache entry can clearly be "dirty" and "valid", thereby indicating that the entry must at some future point be rewritten out to external memory to restore cache coherency. Further, a cache entry can be "clean" and "valid", indicating that the cache entry and the external memory are coherent, or alternatively the cache entry can be "invalid". In an "invalid" state, the terms "dirty" or "clean" have no function or meaning.

By appropriately coding the valid and dirty bits, it can be arranged that the timed circuit generating second output signals on the basis of the first output signals representing the valid and dirty bits will always cause at least one of the corresponding second output signals to transition from its precharged state to the second state, thereby providing a transiton which may be used by the control circuitry to generate a timing signal for controlling the operation of the time circuit. For example, in preferred embodiments, the valid bit has a logic '0' value to indicate an invalid entry, and the dirty bit is arranged to have a logic '1' value if an entry is invalid, irrespective of whether the entry is clean or dirty (as mentioned earlier, the terms "dirty" or "clean" have no meaning when the entry is "invalid"). Hence, in such cases, at least one of the first output signals generated by the subset of components will always represent a logic '1' level, and this can be used to ensure that at least one of the second output signals generated by the timed circuit transitons from its state prior to the generation of the first output signals.

Further, by determining whether, in any particular implementation, an entry is more likely to be clean or dirty at the time that it is invalidated, it is possible to arrange the dirty bit so that it is more likely to be at a logic '1' value at the time the entry is invalidated. For example, if entries are more often clean at the time that they are invalidated, then it is preferable to arrange the dirty bit to have a logic 1 value when clean and a logic 0 value when dirty. By doing this, it is more likely that the dirty bit will have the desired logic 1 value when the entry is invalidate, and this reduces the power consumption slightly (since each transition of the dirty bit from a logic 0 to a logic 1 level consumes power).

Preferably, each memory cell has one or more bit lines connected thereto, the one or more bit lines being precharged to a predetermined voltage level, the memory cells being arranged upon receipt of a command to selectively discharge the one or more bit lines, and the first output signal generated by the memory cell corresponding to the voltage level on the one or more bit lines. In preferred embodiments, each memory cell actually has a pair of bit lines connected thereto which are precharged to a predetermined voltage level, the memory cells being arranged upon receipt of the command to discharge one of the pair of connected bit lines, and the first output signal generated by the element corresponding to the voltage levels on the pair of bit lines.

In such an arrangement, the timed circuit preferably comprises a plurality of sensing circuits, each sensing circuit being arranged to receive the first output signal from a corresponding one of the plurality of memory cells, the difference in voltage levels between the bit lines being used to generate the second output signal with either a first state or a second state. Preferably, the sense circuits are sense amplifiers which amplify the difference in voltage levels between the bit lines to generate the second output signal with either the first or the second state.

Viewed from a second aspect, the present invention provides a method of operating a data processing circuit, comprising the steps of: issuing a command to cause a plurality of components of the data processing circuit to generate substantially simultaneously a plurality of first output signals representing data bits; receiving the first output signals at a timed circuit; generating second output signals for use in subsequent data processing operations, the information content of the second output signals being dependent on the data bits represented by the first output signals; arranging a subset of the components to generate first output signals representing data bits that are coded so as to cause at least one of the generated second output signals to transition from its state prior to the generation of the first output signals; responsive to the state transition of the at least one second output signal, generating a timing signal used to control the operation of the timed circuit.

BRIEF DESCRIPTION OF THE DRAWINGS

The present invention will be described, further by way of example only, with reference to a preferred embodiment thereof as illustrated in the accompanying drawings, in which.

DESCRIPTION OF A PREFERRED EMBODIMENT

Figure 1:
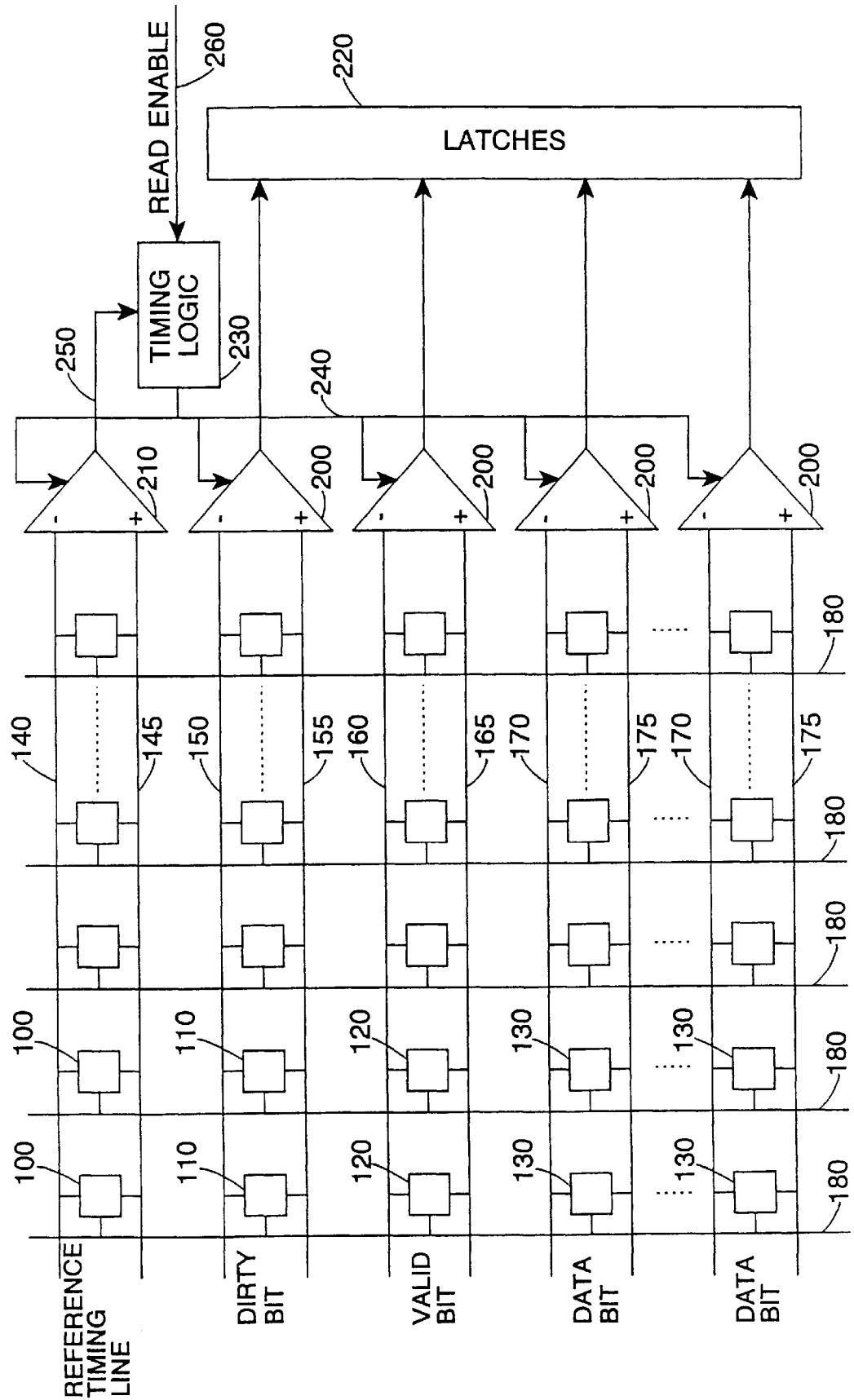
FIG. 1 is a diagram illustrating a cache structure in accordance with the prior art, in which the sense amplifiers are self-timed by a series of additional reference components used to generate a reference timing signal.

For the purposes of describing a preferred embodiment of the present invention, a static RAM structure will be discussed, which is used to store a set of attributes or data values, indexed by a given physical address input. If sense amplifiers are used to achieve a rapid access time, it is desirable to reduce power consumption by self-timing the sense amplifiers to switch off at the earliest opportunity following the arrival of valid output data from the static memory cells within the SRAM structure. Before describing how this self-timing function is performed in accordance with preferred embodiments, a typical prior art approach for performing such self-timing will first be discussed with reference to FIG. 1.

In a typical cache, there will be an array of static memory elements or cells 130 used to store data bits representing data values that may be read from the cache. Each row of the cache will preferably comprise a plurality of static memory elements 130 for storing data bits, a static memory element 120 for storing a valid bit, and a static memory element 110 for storing a dirty bit. In a typical implementation, there may be thirty two (32) static memory elements 130 per row of the cache for storing thirty two data bits, or four bytes of data, per row. Further, for each row in the cache, there will be a word line, or row line, 180 for providing a signal to the memory elements 110, 120 and 130 in that row when it is desired to read out the contents of that row from the cache. This structure is repeated for each row in the cache, and in a typical implementation there may be 1024 rows, thereby providing a cache which can store 4 Kbytes of data (4 bytes multiplied by 1024 rows).

In accordance with a typical prior art system, each row also has a static memory element 100 for storing a reference timing bit, this memory element 100 also being connected to the corresponding word line 180 so that its contents may be read at the same time as the contents of the other memory elements in that row.

Each memory element 100, 110, 120 and 130 has a pair of bit lines 140, 145, 150, 155, 160, 165 and 170, 175, respectively, which are precharged to a predetermined voltage. When a signal is passed over the word line 180 for a particular row of the cache, it causes the memory elements 100, 110, 120 and 130 in that row to discharge one or other of the bit lines connected to those memory elements. Hence, as an example, if a particular memory element is coded to store a logic 0 level, then it may be arranged upon receipt of the signal on the word line 180 to discharge the upper one 140, 150, 160 or 170 of the bit lines, whereas if it is coded with a logic 1 level, it may be arranged to discharge the lower one 145, 155, 165 or 175 of the bit lines.

As these bit lines extend through each row of the cache, and the number of rows may extend into the thousands, then these lines are relatively long, and will take a significant amount of time to discharge fully. Hence, it is known to use sense amplifiers 200, 210 which receive at their inputs the signals from a pair of bit lines, and which are responsive to the dropping of the voltage level on either one of the bit lines to generate an output signal at either a logic 0 or a logic 1 level.

Hence, with reference to FIG. 1, when a signal is passed over a word line 180 to cause the memory elements 100, 110, 120 and 130 in a particular row of the cache to output their contents by discharging one or other of their corresponding bit lines 140, 145, 150, 155, 160, 165, 170 or 175, then a read enable signal is also passed over line 260 to timing logic 230, which then outputs an enable signal on line 240 to switch on the corresponding sense amplifiers 200 and 210. These sense amplifiers will be arranged to have an output at a particular logic level prior to the sensing of the voltages on the bit lines. For the purpose of illustrating the operation, we shall assume that the output from all of the sensing amplifiers 200, 210 is arranged to be at a logic 0 level prior to the evaluation of the signals on the bit lines.

As the memory elements 100, 110, 120 and 130 begin to discharge one or other of their corresponding bit lines, then the corresponding sense amplifiers 200, 210 will identify that the voltage on one of the bit lines is dropping, and will produce an output signal at either a logic 0 or a logic 1 level, dependent on which bit line is being discharged. It will be apparent that if all of the memory elements 110, 120 and 130 are storing bits at a logic 0 level, and hence the corresponding sense amplifiers 200 are arranged to output a logic 0 level upon determining that the voltages on the bit lines 150, 160 and 170 are decreasing, then there will be no perceived difference in the outputs from the sense amplifiers 200, since they will already be outputting a logic 0 level prior to the evaluation stage.

This is the reason why the additional memory elements 100 and sense amplifier 210 are provided, along with bit lines 140 and 145 having an identifcal length to the other bit lines 150, 155, 160, 165 and 170, 175. The reference timing bit in the memory elements 100 may always be set such that there is a transition at the output of the sense amplifier 210 when the contents of those memory elements 100 are read. Assuming the output from the sense amplifier 210 is a logic 0 level in the precharged state, then the bit information encoded into the memory elements 100 will be such as to cause the output from the sense amplifier 210 to transition to a logic 1 level when the contents of any one of the memory elements 100 is read. The output from the sense amplifier 210 will be passed over path 250 to the timing logic 230, which will then cause a disable signal to be passed over path 240 to all of the sense amplifiers 200, 210, thereby turning the sense amplifiers off to conserve power.

Since all of the memory elements 100, 110, 120 and 130 in a particular row of the cache will discharge one of their bit lines simultaneously, and all of the bit lines are arranged to have the same length, then all of the sense amplifiers will evaluate the signals on the bit lines at the same time, and produce a corresponding output. Hence, it is safe to assume that, by the time the timing logic 230 has handled transition signal output by the sense amplifier 210, then all of the other sense amplifiers 200 will also have evaluated their corresponding bit line inputs and produced a corresponding output signal, the output signals from the sense amplifiers 200 preferably being latched in the latches 220 for use in subsequent processing operations.

While the above approach provides an effective technique for turning the sense amplifiers off at the earlies possible time, thereby conserving power, it has the disadvantage that additional reference components in the form of memory elements 100, bit lines 140, 145, and sense amplifier 210, need to be provided to perform this self-timing function, these additional components adding to the physical area required for the cache, and also adding to the power consumption of the cache. As an illustration of the additional power consumption consumed by the reference timing components, consider the example of a thirty two (32) bit wide cache, which additionally has a dirty bit and a valid bit for each row of the cache, thereby resulting in thirty four (34) memory elements in a row. By adding a reference timing component, the total count is increased to thirty five (35) memory elements per row. Further, in practice, in any particular read operation, only some of the outputs from the sense amplifiers 200 will transition, whereas the output from the sense amplifier 210 will always transition, and thereby consume power. If only half of the sense amplifiers 200 generate a transition in their output signals as a result of evaluating the voltages on the bit lines, then the reference timing transition generated by the sense amplifier 210 will be responsible for $\frac{1}{18}$th of the total power required to transition the outputs (seventeen (17) of the thirty four (34) sense amplifiers 200 transitioning, and the sense amplifier 210 always transitioning). Hence, it will be apparent that the power consumption of the reference timing components is quite significant in relation to the total power consumption of the cache.

Figure 2:
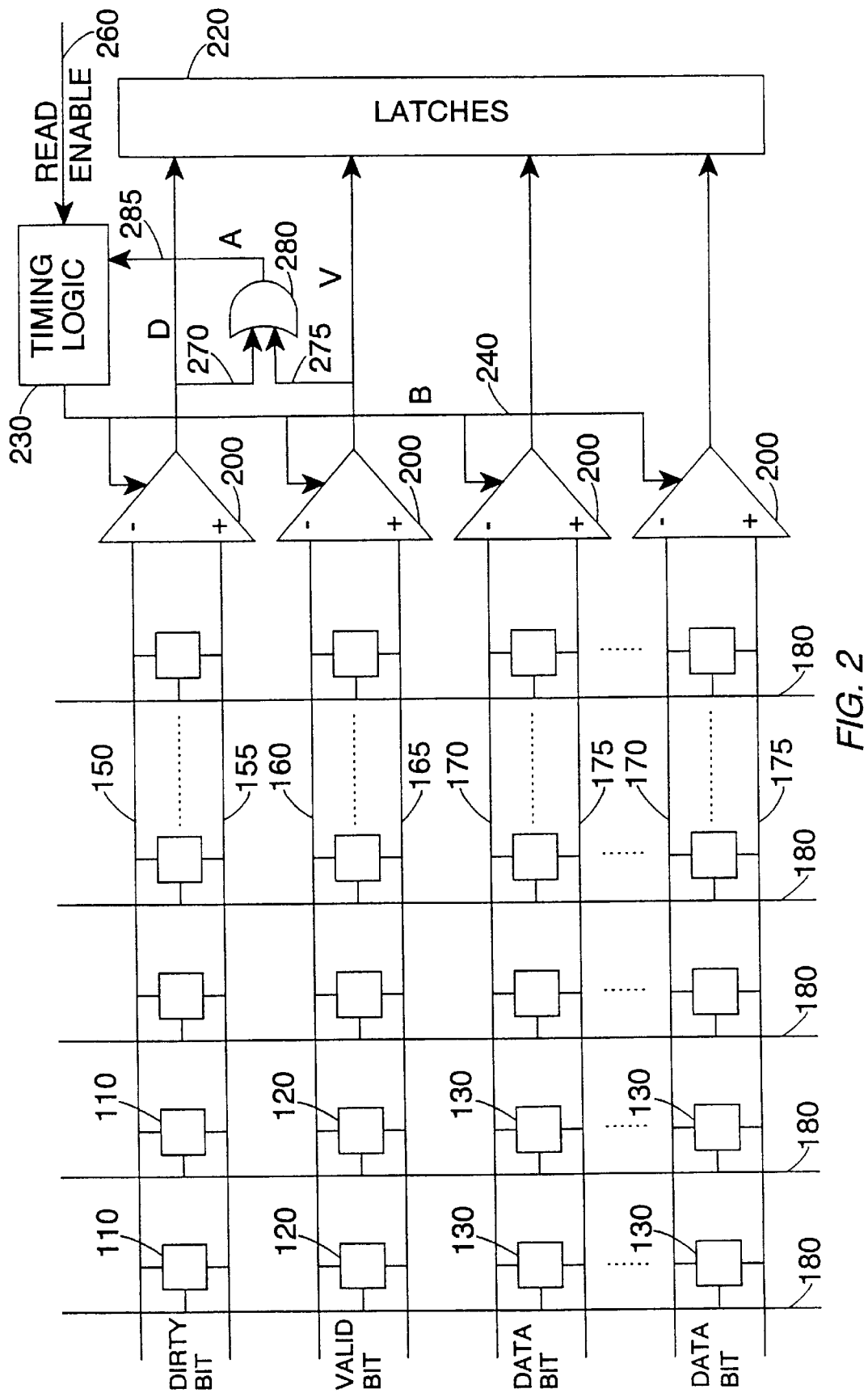
FIG. 2 is a diagram illustrating a cache structure in accordance with preferred embodiments of the present invention, in which no additional reference components are required to self-time the sense amplifiers.

In accordance with preferred embodiments of the present invention, the above identified problems concerning the physical area of the cache, and the power consumption required for self-timing, are alleviated by the structure illustrated in FIG. 2. In accordance with preferred embodiments, the requirement for additional memory elements 100, bit lines 140, 145, and sense amplifier 210 is removed. Instead, the bits used to encode the dirty and valid information are coded such that at least one of the output signals from the corresponding sense amplifiers 200 will have a transition at their output when any row of the cache is read.

As mentioned earlier, the dirty bit is used to identify whether the cache entry in the corresponding row has or has not been altered since it was placed in the cache, and the valid bit is used to identify whether the cache entry is still valid, or has been rendered useless for any reason. a cache entry can clearly be dirty and valid, indicating that it must at some future point be rewritten out to external memory to restore cache coherency, or can be "clean" and "valid", indicating that the cache entry and the external memory are coherent. Further, the cache entry may be "invalid", but in the "invalid" state, the terms "dirty" or "clean" have no functional meaning. Hence, assuming that the dirty bit is encoded such that a logic 0 corresponds to clean and a logic 1 corresponds to dirty, and that the valid bit is encoded such that a logic 0 corresponds to invalid and a logic 1 corresponds to valid, then the following logic table can be used to derive the meaning of various combinations of the valid and dirty bit:

| Valid Bit | Dirty Bit | Meaning |
| --- | --- | --- |
| 0 | 0 | None |
| 0 | 1 | Invalid |
| 1 | 0 | Valid and Clean |
| 1 | 1 | Valid and Dirty |

The above table illustrates that, by ensuring that all "invalid" entries are marked as "dirty", the combination (0, 0) may be outlawed. As mentioned earlier, when an entry is "invalid", and hence the valid bit is "0", then the dirty bit has no relevance, so that it does not matter if the dirty bit is always coded as a "1" when the entry is invalid. In this situation, if sense amplifiers 200 are used whose precharged output is a logic 0 level, then at least one of the dirty bit or valid bit stored in memory elements 110 or 120 will have a logic 1 value for each row of the cache, and hence at least one of the signals output by the corresponding sense amplifiers 200 will transition from a precharged logic 0 state to a logic 1 state when evaluating the bit lines.

An alternative approach to the above is to arrange the dirty bit so that it has a logic 1 value when the entry is clean, and a logic 0 value when the entry is dirty. The following logic table can then be used to derive the meaning of various combinations of the valid and dirty bit:

| Valid Bit | Dirty Bit | Meaning |
|-----------|-----------|---------|
| 0 | 0 | None |
| 0 | 1 | Invalid |
| 1 | 0 | Valid and Dirty |
| 1 | 1 | Valid and Clean |

Depending on how the cache is used, and the nature and frequency of cache replacements, an entry may be more likely to be clean rather than dirty at the time that it is invalidated. If this is the case, then arranging the dirty bit to have a logic 1 value when the entry is clean reduces the likelihood of having to alter the dirty bit to a logic 1 value when the valid bit is changed to a logic 0 value to indicate an invalid entry. Hence, this measure can reduce power consumption still further.

The outputs from all of the sense amplifiers 200 will typically be used for further processing operations, and hence, in preferred embodiments, all of the output signals are latched in the latches 220. However, in addition, an OR gate 280 is arranged to receive the output signals from the two sense amplifiers 200 evaluating the dirty and valid bit information, these output signals being passed to the OR gate over paths 270 and 275, respectively. Since at least one of these two sense amplifiers 200 will always have an output which transitions to a logic 1 level in response to the evaluation of the bit lines, then the OR gate 280 will always receive at least one logic 1 value at its input in response to the evaluation of the bit lines by the sense amplifiers 200. This will cause a logic 1 value to be generated on path 285 and input to the timing logic 230. The timing logic 230 will be arranged to respond to a logic 1 value on the path 285 to generate a disable timing signal on path 240 which will be input to all of the sense amplifiers 200 to turn those sense amplifiers off.

Since the bit lines 150, 155, 160, 165, and 170, 175 are all of the same length, and the memory elements 110, 120 and 130 are caused to discharge one of their bit lines simultaneously, then the sense amplifiers will always evaluate the inputs from the corresponding bit lines at the same time, and hence it can be assumed that all sense amplifiers 200 have evaluated their inputs by the time the timing logic 230 receives the logical one value on path 285. Hence, it is safe at that stage to disable the sense amplifiers 200 in order to ensure that they do not consume any further power consumption. However, if desired, the input threshold of the sense amplifiers evaluating the valid and dirty bit information could be arranged to be different to the input threshold of the other sense amplifiers to ensure that all sense amplifiers will have evaluated their inputs by the time the valid and dirty bit sense amplifiers have evaluated their inputs.

It will be apparent that, by employing the structure illustrated in FIG. 2, less components are required than in the prior art structure illustrated in FIG. 1, and hence the cache will require less physical area than the prior art caches which required the extra reference timing components to perform the self-timing function. In addition, the structure in accordance with FIG. 2 will consume less power than the prior art structure illustrated in FIG. 1, since there is no requirement to duplicate the critical path of the cache by the use of additional reference components.

It will be appreciated that the logic levels used to illustrate the preferred embodiment could be reversed, such that the output from the sense amplifiers is at a logic 1 level in the precharged state, and the dirty and valid bits are coded such that at least one of the outputs from the corresponding sense amplifiers transitions to a logic "0" level on evaluating the bit lines. the logic then used instead of OR gate 280 would depend on whether a logic "0" level or a logic "1" level was required on path 285 to cause the timing logic 230 to create a disable timing signal on path 240. If a logic "0" level is required on path 285, then an AND gate can be used instead of OR gate 280, while if a logic "1" level is required, then a NAND gate can be used.

Figure 3:
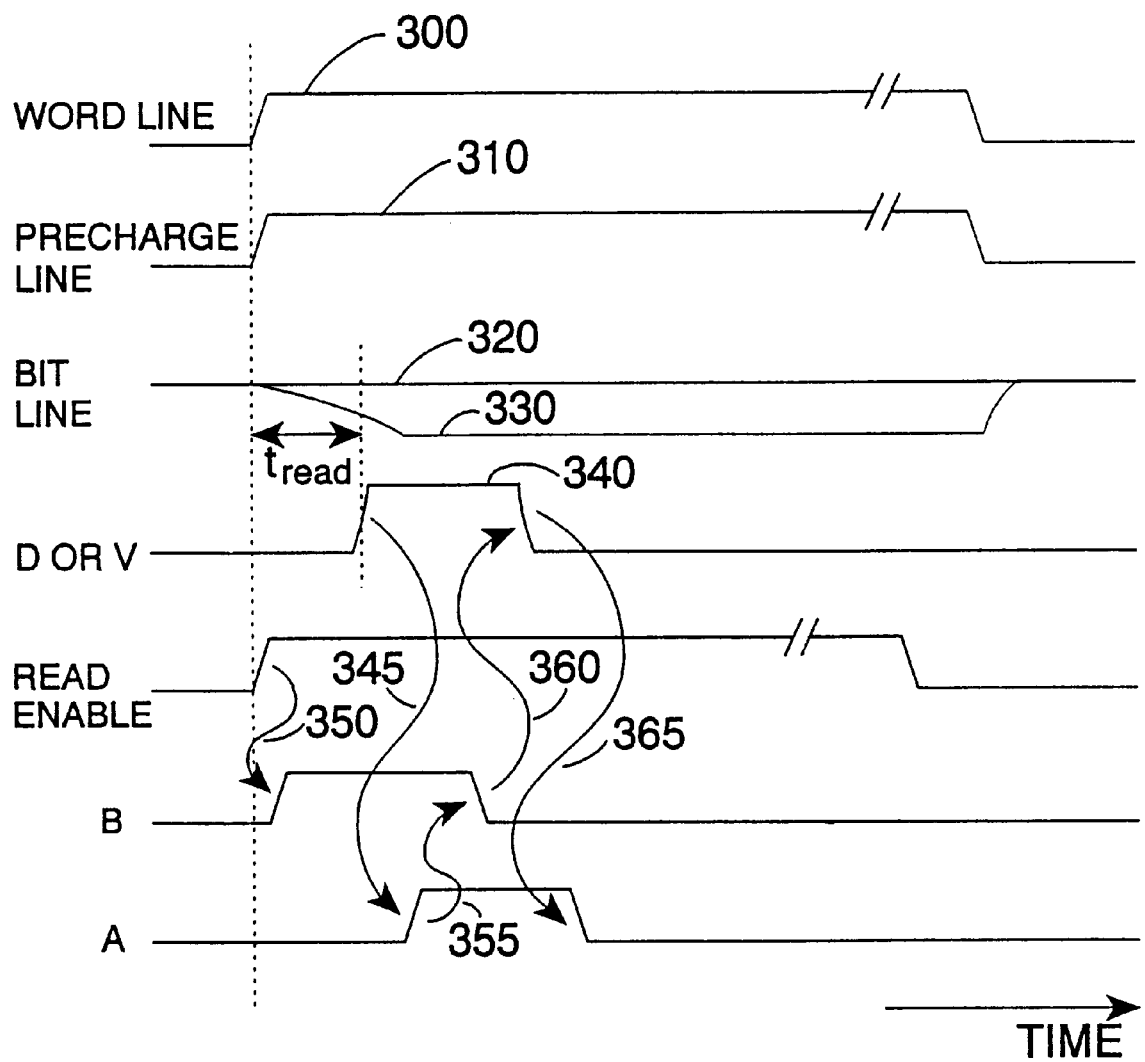
FIG. 3 is a timing diagram illustrating a suitable timing for signals used in the system of the preferred embodiment illustrated in FIG. 2.

FIG. 3 is a timing diagram illustrating suitable timing for the signals in FIG. 2. In preferred embodiments, a precharge line 310 is arranged such that, when in a logic 0 state, the bit lines are precharged to a predetermined voltage, and the output from the sense amplifiers are set to a logic 0 state. When the signal 300 on one of the word lines changes from a logic 0 to a logic 1 state, then the signal on the precharge line 310 also changes to a logic 1 state to stop the precharging process used to maintain the bit lines at their predetermined voltage. This enables the addressed memory elements to begin to discharge one of their bit lines. As illustrated in FIG. 3, one of the bit lines 320 will be maintained at the predetermined voltage, while the other of the bit lines 330 will be slowly discharged such that the voltage decreases over time. After a certain period of time, $t_{READ}$, the sense amplifiers 200 will have detected the discharging of the voltage on one of the bit lines, and at least one of the output signals D or V from the sense amplifiers reading the dirty and valid bit information will have transitioned from a logic 0 to a logic 1 level 340. As illustrated by the arrow 345 in the timing diagram, this will cause the output from the OR gate on line A to transition from a logic 0 to a logic 1 state.

When the word line signal 300 transitioned from the logic 0 to the logic 1 state, the read enable signal will also have transitioned from a logic 0 to a logic 1 state, and, as illustrated by the line 350 in FIG. 3, this will have caused the signal on line B in FIG. 2 to transition from a logic 0 to a logic 1 state in order to switch the sense amplifiers on to enable them to sense the voltages on the bit lines. When the signal on line A in FIG. 2 to the timing logic has been driven high, then, as indicated by line 355 in FIG. 3, this will cause the signal on line B of FIG. 2 to return to the logic 0 level, thereby switching off the sense amplifiers, and causing a precharge transistor within the sense amplifier to return the outputs from the sense amplifiers to their precharged state. Hence, as illustrated by the line 360 in FIG. 3, the outputs from the sense amplifiers on D and V will be returned to the logic 0 level, this being the precharged state of the output from the sense amplifiers. As illustrated by the line 365 in FIG. 3, this will then cause the output of the OR gate on path A in FIG. 2 to return to the logic 0 state. At some subsequent point, the read enable signal on line 260 in FIG. 2 will be returned to the logic 0 state, as will the word line signal 300 and the precharge line signal 310. Once the precharge line signal 310 has returned to the logic 0 state, this will cause the bit lines to be precharged again to their predetermined voltage levels in preparation for a subsequent read of the cache.

Figure 4A:
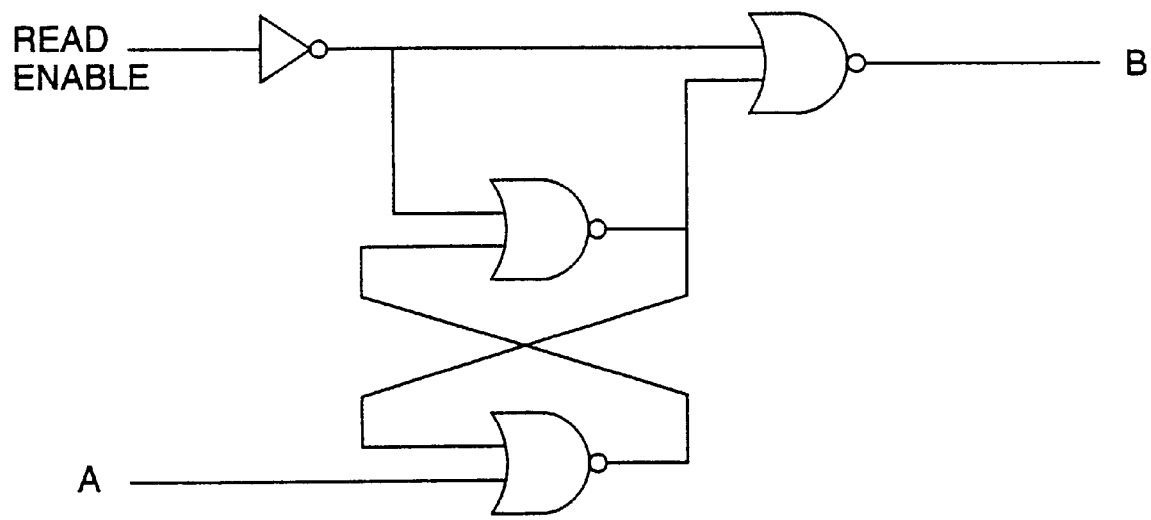
FIGS. 4A and 4B illustrate suitable logic arrangements that may be used to implement the timing logic illustrated in FIG. 2.

FIG. 4A is a logic diagram illustrating a suitable implementation for the timing logic 230 in FIG. 2. Assuming that both the read enable signal and the signal on line A input to the timing logic 230 are both at logic "0" levels, then it will be apparent that the output signal on line B will also be at a logic "0" level. Once the read enable signal transitions to a logic 1 level, and assuming that the signal on line A remains at a logic 0 level, then the output on the path B will also transition to a logic 1 level, thereby turning the sense amplifiers on to enable the sensing of the voltage on the bit lines. However, once the signal on line A transitions to a logic 1 level, indicating that the evaluation of the voltage on the bit lines has taken place, then this will cause the output on line B to transition to a logic 0 level, despite the fact that the read enable signal is still at a logic 1 level. This will ensure that the sense amplifiers are turned off immemdiately after the evaluation step to ensure that no further power dissipation by the sense amplifiers takes place.

Figure 4B:
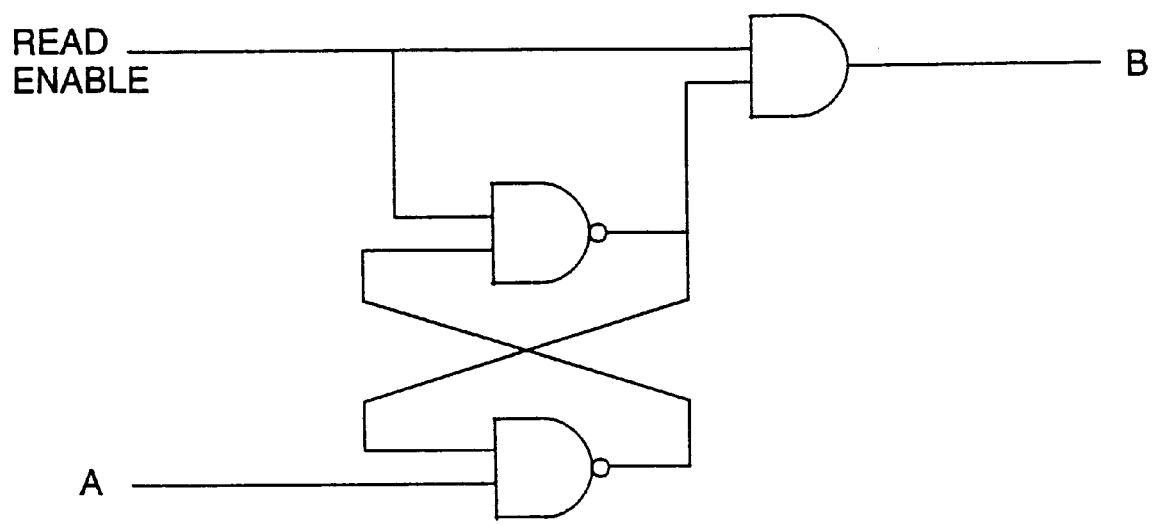

FIG. 4B illustrates an alternative implementation for the timing logic 230 in situations where the signal on path A is at a logic 1 level in the precharged state, and transitions to a logic 0 level upon evaluation of the bit lines. Assuming that the read enable signal is "0" and the signal on line A is at a logic "1" level, then it will be apparent that the output signal on line B will be at a logic "0" level. Once the read enable signal transitions to a logic 1 level, and assuming that the signal on line A remains at a logic 1 level, then the output on the path B will also transition to a logic 1 level, thereby turning the sense amplifiers on to enable the sensing of the voltage on the bit lines. However, once the signal on line A transitions to a logic 0 level, indicating that the evaluation of the voltage on the bit lines has taken place, then this will cause the output on line B to transition to a logic 0 level, despite the fact that the read enable signal is still at a logic 1 level. This will ensure that the sense amplifiers are turned off immediately after the evaluation step to ensure that no further power dissipation by the sense amplifiers takes place.

Although a particular embodiment of the invention has been described herewith, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A data processing circuit, comprising:
    a plurality of components arranged to be responsive to a command signal to generate substantially simultaneously a plurality of first output signals, each output signal representing variable data bits;
    a timed circuit arranged to receive the plurality of first output signals and to generate second output signals for use in subsequent data processing operations, the information content of the second output signals being dependent on the variable data bits represented by the plurality of first output signals;
    a subset of the components being arranged to generate respective ones of said plurality of first output signals representing variable data bits that are coded so as to cause at least one of the second output signals generated by the timed circuit to transition from its state prior to the generation of the plurality of first output signals; and
    control circuitry, responsive to the state transition of said at least one of the second output signals to generate a timing signal used to control the operation of said timed circuit.

2. A data processing apparatus as claimed in claim 1, wherein said timed circuit comprises a plurality of sensing circuits, each sensing circuit being arranged to receive one of said plurality of first output signals from corresponding one of said plurality of components, the second output signals having a predetermined first state prior to the generation of said plurality of first output signals, and the sensing circuits being arranged to determine from the received first output signals whether to change their respective second output signals to a second state.

3. A data processing circuit as claimed in claim 2, wherein said subset of the components is arranged to generate respective ones of said plurality of first output signals representing data bits that are coded so as to cause at least one of the second output signals generated by the corresponding subset of sensing circuits to transition from the first state to the second state.

4. A data processing circuit as claimed in claim 3, wherein said control circuitry comprises a logic gate arranged to receive said at least one of the second output signals and to generate a timing signal used to disable said sensing circuits.

5. A data processing circuit as claimed in claim 4, wherein said first state corresponds to a logic 0 level and said second state corresponds to a logic 1 level, and said logic gate is a logical OR gate arranged to receive said at least one of the second output signals and to generate a timing signal having a logic 1 level used to disable said sensing circuits when said at least one of the second output signals has said second state.

6. A data processing apparatus as claimed in claim 1, wherein said components are memory cells.

7. A data processing circuit as claimed in claim 6, wherein said memory cells are elements within a cache.

8. A data processing circuit as claimed in claim 6, wherein said subset of the components comprise those memory cells containing dirty and valid bit information.

9. A data processing circuit as claimed in claim 8, wherein each valid bit has a logic '0' value to indicate an invalid entry, and each dirty bit is arranged to have a logic '1' value if a corresponding entry is invalid, irrespective of whether that entry is clean or dirty.

10. A data processing circuit as claimed in claim 6, wherein the memory cells are static memory cells.

11. A data processing circuit as claimed in claim 6, wherein each memory cell has one or more bit lines connected thereto, the one or more bit lines being precharged to a predetermined voltage level, the memory cells being arranged upon receipt of said command signal to selectively discharge the one or more bit lines, and the plurality of first output signals that are generated by the memory cells corresponding to the voltage levels on the corresponding one or more bit lines.

12. A data processing circuit as claimed in claim 11, wherein each memory cell has a pair of bit lines connected thereto which are precharged to a predetermined voltage level, each memory cell being arranged upon receipt of said command signal to discharge one of a corresponding pair of bit lines, and the corresponding first output signal that is generated by the memory cell corresponding to the voltage levels on the corresponding pair of bit lines.

13. A data processing circuit as claimed in claim 12, wherein said timed circuit comprises a plurality of sensing circuits, each sensing circuit being arranged to receive one of the plurality of first output signals from a corresponding one of said plurality of memory cells, the difference in voltage levels between the bit lines being used to generate said second output signals with either a first state or a second state.

14. A data processing circuit as claimed in claim 13, wherein said sensing circuits are sense amplifiers which amplify the difference in voltage levels between the bit lines to generate said second output signals with either said first state or said second state.

15. A method of operating a data processing circuit, comprising the steps of:

issuing a command signal to cause a plurality of components of the data processing circuit to generate substantially simultaneously a plurality of first output signals, each of said plurality of first output signals representing variable data bits;

receiving the plurality of first output signals at a time circuit of the data processing circuit;

generating second output signals for use in subsequent data processing operations, the information content of the second output signals being dependent on the variable data bits represented by the first output signals;

arranging a subset of the components to generate respective ones of said plurality of first output signals representing variable data bits that are coded so as to cause at least one of the generated second output signals to transition from its state prior to the generation of the plurality of first output signals;

responsive to the state transition of said at least one of the second output signals, generating a timing signal used to control the operation of said time circuit.

16. A method as claimed in claim 15, wherein said timed circuit comprises a plurality of sensing circuits, the method comprising the steps of:

arranging each sensing circuit to receive one of said plurality of first output signals from a corresponding one of said plurality of components, the second output signals having a predetermined first state prior to the generation of said plurality of first output signals;

arranging the sensing circuits to determine from the received first output signals whether to change their respective second output signals to a second state.

17. A method as claimed in claim 16, further comprising the steps of:

arranging said subset of the components to generate respective ones of said plurality of first output signals representing data bits that are coded so as to cause at least one of the second output signals generated by the corresponding subset of sensing circuits to transition from the first state to the second state.

18. A method as claimed in claim 15, wherein the components are memory cells, and wherein said subset of the components comprises those memory cells containing dirty and valid bit information.

* * * * *